United States Patent
Kim et al.

(10) Patent No.: US 9,029,899 B2
(45) Date of Patent: May 12, 2015

(54) LIGHT EMITTING DEVICE AND LIGHT EMITTING DEVICE PACKAGE

(75) Inventors: Sung Kyoon Kim, Seoul (KR); Sung Ho Choo, Seoul (KR); Hyun Seoung Ju, Seoul (KR); Jae Won Seo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 85 days.

(21) Appl. No.: 13/399,751

(22) Filed: Feb. 17, 2012

(65) Prior Publication Data

US 2012/0326199 A1 Dec. 27, 2012

(30) Foreign Application Priority Data

Jun. 23, 2011 (KR) .................. 10-2011-0061389

(51) Int. Cl.
H01L 33/62 (2010.01)
H01L 41/29 (2013.01)
H01L 51/50 (2006.01)
H01L 33/20 (2010.01)
H01L 33/38 (2010.01)
H01L 33/42 (2010.01)

(52) U.S. Cl.
CPC .............. *H01L 33/20* (2013.01); *H01L 33/38* (2013.01); *H01L 33/42* (2013.01); *H01L 2924/0002* (2013.01)

(58) Field of Classification Search
CPC ......... H01L 33/66; H01L 51/50; H01L 33/36; H01L 33/387; H01L 33/38
USPC ............................ 257/99, 59, 80, 82, E33.065
See application file for complete search history.

(56) References Cited

U.S. PATENT DOCUMENTS

| | | | | |
|---|---|---|---|---|
| 7,652,296 B2* | 1/2010 | Chu | ............................... | 257/79 |
| 2004/0140473 A1 | 7/2004 | Chen | | |
| 2006/0192223 A1* | 8/2006 | Lee et al. | ......................... | 257/99 |
| 2010/0255323 A1* | 10/2010 | Nakamura et al. | ............ | 428/457 |
| 2011/0012152 A1* | 1/2011 | Lim et al. | ......................... | 257/98 |
| 2011/0140161 A1* | 6/2011 | Lim et al. | ........................ | 257/99 |

FOREIGN PATENT DOCUMENTS

| | | |
|---|---|---|
| EP | 1 848 043 A1 | 10/2007 |
| EP | 2 296 197 A1 | 3/2011 |
| WO | WO 01/41223 A1 | 6/2001 |

* cited by examiner

*Primary Examiner* — Brett Feeney
*Assistant Examiner* — Damon Hillman
(74) *Attorney, Agent, or Firm* — Birch, Stewart, Kolasch & Birch, LLP

(57) ABSTRACT

Disclosed are a light emitting device and a light emitting device package. The light emitting device includes a light emitting structure including a first conductive semiconductor layer, an active layer on the first conductive semiconductor layer, and a second conductive semiconductor layer on the active layer, a first electrode on the first conductive semiconductor layer, a transparent electrode on the second conductive semiconductor layer, and a second electrode on the transparent electrode. The first electrode includes a first electrode pad on a first region of the first conductive semiconductor layer exposed from the second conductive semiconductor layer and the active layer and a first electrode finger part extending from the first electrode pad toward a second region, in which the first conductive semiconductor layer is exposed. A gap between the transparent electrode and the first electrode finger part is gradually narrowed from the first region toward the second region.

19 Claims, 12 Drawing Sheets

LIGHT EMITTING DEVICE AND LIGHT EMITTING DEVICE PACKAGE

The present application claims priority under 35 U.S.C. 119 to Korean Patent Application No. 10-2011-0061389, filed on Jun. 23, 2011, which is hereby incorporated by reference in its entirety.

BACKGROUND

The embodiment relates to a light emitting device, a method for fabricating the same, a light emitting device package, and a light unit.

A light emitting diode (LED) has been extensively used as one of light emitting devices. The LED converts electrical signals into the form of light such as infra-red light, ultraviolet light, and visible light by using the characteristic of a compound semiconductor.

As the light efficiency of the light emitting device is increased, the LED has been used in various fields such as display apparatuses and lighting appliances.

SUMMARY

The embodiment provides a light emitting device having a novel structure, a light emitting device package, and a light unit.

The embodiment provides a light emitting device capable of improving light extraction efficiency, a method for fabricating the same, a light emitting device package, and a light unit.

According to the embodiment, there is provided a light emitting device comprising a light emitting structure comprising a first conductive semiconductor layer, an active layer on the first conductive semiconductor layer, and a second conductive semiconductor layer on the active layer, a first electrode on the first conductive semiconductor layer, a transparent electrode on the second conductive semiconductor layer, and a second electrode on the transparent electrode. The first electrode comprises a first electrode pad on a first region of the first conductive semiconductor layer exposed from the second conductive semiconductor layer and the active layer and a first electrode finger part extending from the first electrode pad toward a second region, in which the first conductive semiconductor layer is exposed. The gap between the transparent electrode and the first electrode finger part is gradually narrowed from the first region toward the second region.

According to the embodiment, there is provided a light emitting device package comprising a body, a light emitting device on the body, and first and second lead electrodes electrically connected to the light emitting device. The light emitting device comprises a light emitting structure comprising a first conductive semiconductor layer, an active layer on the first conductive semiconductor layer, and a second conductive semiconductor layer on the active layer, a first electrode on the first conductive semiconductor layer, a transparent electrode on the second conductive semiconductor layer, and a second electrode on the transparent electrode, the first electrode comprises a first electrode pad on a first region of the first conductive semiconductor layer exposed from the second conductive semiconductor layer and the active layer and a first electrode finger part extending from the first electrode pad to a second region, in which the first conductive semiconductor layer is exposed, and a gap between the transparent electrode and the first electrode finger part is gradually narrowed from the first region toward the second region.

According to the embodiment, there is provided a light unit comprising a board, a light emitting device provided on the board, and an optical member through which light supplied from the light emitting device passes. The light emitting device comprises a light emitting structure comprising a first conductive semiconductor layer, an active layer on the first conductive semiconductor layer, and a second conductive semiconductor layer on the active layer, a first electrode on the first conductive semiconductor layer, a transparent electrode on the second conductive semiconductor layer, and a second electrode on the transparent electrode, the first electrode comprises a first electrode pad on a first region of the first conductive semiconductor layer exposed from the second conductive semiconductor layer and the active layer and a first electrode forger part extending from the first electrode pad to a second region, in which the first conductive semiconductor layer is exposed, and a gap between the transparent electrode and the first electrode finger part is gradually narrowed from the first region toward the second region.

As described above, the embodiment can provide a light emitting device having a novel structure, a light emitting device package, and a light unit.

The embodiment can provide a light emitting device capable of improving light extraction efficiency and increasing a product yield, a method for fabricating the same, a light emitting device package, and a light unit.

DETAILED DESCRIPTION OF THE EMBODIMENTS

Figure 1:
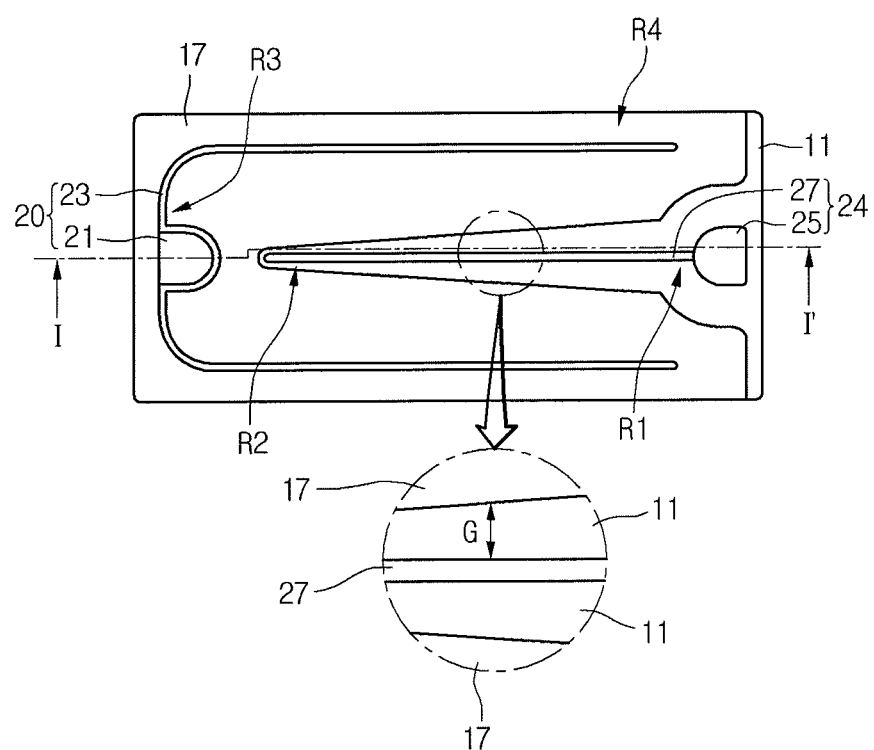
FIG. 1 is a view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a light emitting device package, a light unit, and a method for fabricating the same according to the embodiments will be described in detail with reference to accompanying drawings.

Figure 2:
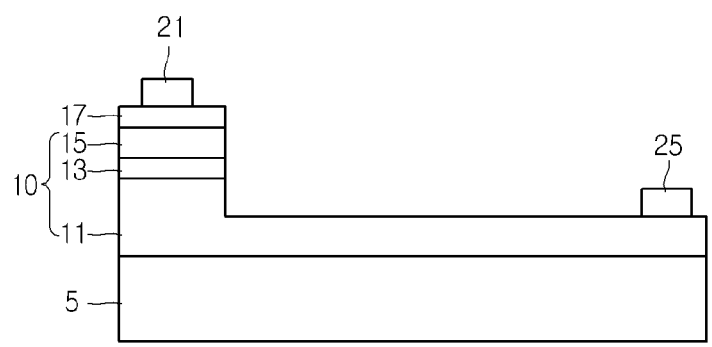
FIG. 2 is a sectional view taken along line IT of the light emitting device shown in FIG. 1.

FIG. 1 is a view showing a light emitting device according to the embodiment, and FIG. 2 is a sectional view taken along line I-I' of the light emitting device shown in FIG. 1.

As shown in FIGS. 1 and 2, the light emitting device according to the embodiment may comprise a substrate 5, a light emitting structure 10, a transparent electrode 17, a first electrode 24, and a second electrode 20.

The light emitting structure 10 may be provided on the substrate 5. The substrate 5 may comprise at least one selected from the group consisting of sapphire (Al2O3), SiC, Si, GaAs, GaN, ZnO, GaP, InP, and Ge. A top surface of the substrate 5 may be patterned in a predetermined shape. A buffer layer may be interposed between the substrate 5 and the light emitting structure 10 to improve crystalline of the light emitting structure 10. For example, the buffer layer may be realized by using a compound semiconductor comprising group III-V elements. The buffer layer may be realized by using an undoped semiconductor layer. For example, the buffer layer may be realized by an undoped GaN-based semiconductor layer.

The light emitting structure 10 may comprise a first conductive semiconductor layer 11, an active layer 13, and a second conductive semiconductor layer 13. For example, the first conductive semiconductor layer 11 may comprise an N-type semiconductor layer doped with N-type dopants serving as first conductive dopants, and the second conductive semiconductor layer 15 may comprise a P-type semiconductor layer doped with P-type dopants serving as second conductive dopants. In addition, the first conductive semiconductor layer 11 may comprise a P-type semiconductor layer, and the second conductive semiconductor layer 15 may comprise an N-type semiconductor layer.

For example, the first conductive semiconductor layer 11 may comprise an N-type semiconductor layer. The first conductive semiconductor layer 11 may be realized by using a compound semiconductor. The first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of GaN, AlN, AlGaN, InGaN, InN, InAlGaN, AlInN, AlGaAs, GaP, GaAs, GaAsP, and AlGaTnP doped with N-type dopants such as Si, Ge, Sn, Se, and Te.

The active layer 13 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 15. The active layer 13 may have one of a single quantum well (SQW) structure, a multi-quantum well (MQW) structure, a quantum dot structure, and a quantum wire structure, but the embodiment is not limited thereto.

For example, the active layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 13 has an MQW structure, the active layer 13 may be formed by stacking a plurality of well layers and a plurality of barrier layers. For example, the active layer 13 may have a cycle of InGaN well layer/GaN barrier layer. In addition, the active layer 13 may have a cycle of well layer/barrier layer, for example, a cycle of $In_xAl_yGa_{(1-x-y)}N$ well layer/$In_aAl_bGa_{(1-a-b)}N$ barrier layer ($0<x \leq 1$, $0 \leq y \leq 1$, $0 \leq x+y \leq 1$, $0 \leq a \leq 1$, $0 \leq b \leq 1$, $0 \leq a+b \leq 1$) by using a compound semiconductor material comprising group III-V elements.

For example, the second conductive semiconductor layer 15 may comprise a P-type semiconductor layer. The second conductive semiconductor layer 15 may be realized by using a compound semiconductor. The second conductive semiconductor layer 15 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 15 may comprise one selected from the group consisting of GaN, MN, AlGaN, InGaN, InN, InAlGaN, AlInN, AlGaAs, GaP, GaAs, GaAsP, and AlGaTnP doped with P-type dopants such as Mg, Zn, Ca, Sr, and Ba.

Meanwhile, the first conductive semiconductor layer 11 may comprise a P-type semiconductor layer and the second conductive semiconductor layer 15 may comprise the N-type semiconductor layer. In addition, a third semiconductor layer (not shown) comprising an N-type or P-type semiconductor layer may be additionally disposed on the second conductive semiconductor layer 15. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 13. In addition, a second conductive AlGaN layer may be formed between the second conductive semiconductor layer 15 and the active layer 13.

The first electrode 24 may be provided on the first conductive semiconductor layer 11. The first electrode 24 may comprise a first electrode pad 25 and a first electrode finger part 27. The first electrode 24 may make contact with the first conductive semiconductor layer 11. The first electrode 24 may be provided on the first conductive semiconductor layer 11 exposed from the second conductive semiconductor layer 15 and the active layer 13. The first electrode pad 25 may be provided in a first region R1 of the first conductive semiconductor layer 11 that is exposed. The first electrode finger part 27 may extend from the first electrode pad 25 to a second region R2 of the first conductive semiconductor layer 11 that is exposed.

The transparent electrode 17 and the second electrode 20 may be provided on the second conductive semiconductor layer 15. The second electrode 20 may comprise a second electrode pad 21 and a second electrode finger part 23. The second electrode pad 21 may be provided in a third region R3 of the second conductive semiconductor layer 15. The second electrode finger part 23 may extend from the second electrode pad 21 to a fourth region R4 of the second conductive semiconductor layer 15.

The first and second electrodes 24 and 20 may supply power to the light emitting structure 10. The power applied to the first electrode pad 25 may be applied to the first conductive semiconductor layer 11 through the first electrode finger part 27. The power applied to the second electrode pad 21 may be applied to the second conductive semiconductor layer 15 through the second electrode finger part 23. The power applied to the second electrode finger part 23 may be applied to the second conductive semiconductor layer 15 through the transparent electrode 17.

The transparent electrode 17 may be interposed between the second electrode pad 21 and the second conductive semiconductor layer 15. The transparent electrode 17 may make an ohmic contact between the second electrode pad 21 and the second conductive semiconductor layer 15. The transparent electrode 17 may be interposed between the second electrode finger part 23 and the second conductive semiconductor layer 15. The transparent electrode 17 may make an ohmic contact between the second electrode finger part 23 and the second conductive semiconductor layer 15. The transparent electrode 17 may be provided on the second conductive semiconductor layer 15. The transparent electrode 17 may supply the power applied to the second electrode pad 21 to the second conductive semiconductor layer 15 by spreading the power.

For example, the transparent electrode 17 may comprise a transparent conductive oxide layer. The transparent electrode 17 may comprise a transparent metallic layer. The transparent electrode 17 may comprise a conductive material representing at least 50% of transmittance. The transparent electrode 17 may comprise at least one material selected from the group consisting of ITO, IZO, AZO, AGZO, IZTO, IAZO, IGZO, IGTO, ATO, GZO, IZON, ZnO, IrOx, RuOx, NiO, and Ni/Au.

According to the embodiment, the second conductive semiconductor layer 15 and the active layer 13 may be provided in the vicinity of the first electrode finger part 27. A gap G between the second conductive semiconductor layer 15 and the first electrode finger part 27 may be gradually narrowed from the first region R1, in which the first electrode pad 25 is provided, toward the second region R2 in which the end portion of the first electrode finger part 27 is provided. In other words, the second conductive semiconductor layer 15 may be etched in an inverse V shape from the first region R1, into which electrons or holes are injected according to the application of power, toward the second region R2. The gap G between the active layer 13 and the first electrode finger part 27 may be gradually reduced from the first region R1, in which the first electrode pad 25 is provided, toward the second region R2, in which the end portion of the first electrode finger part 23 is provided. The active layer 13 may be etched in an inverse V shape from the first region R1, into which electrons or holes are injected according to the application of power, toward the second region R2.

According to the embodiment, the transparent electrode 17 may be provided in the vicinity of the first electrode finger part 27. The gap between the transparent electrode 17 and the first electrode finger part 17 may be gradually narrowed from the first region, in which the first electrode pad 25 is provided, toward the second region in which the end portion of the first electrode finger part 27 is provided.

According to the embodiment, the first electrode 24 and the second conductive semiconductor layer 15 may be provided at the greatest gap in the first region in which the first electrode pad 25 is provided. For example, the gap between the first electrode pad 25 and the second conductive semiconductor layer 15 may be provided in the range of about 2 μm to about 200 μm in the first region. In addition, the first electrode 24 and the second conductive semiconductor layer 15 may be provided at the smallest gap in the second region in which the end portion of the first electrode pad 25 is provided.

According to the embodiment, the first electrode 24 and the transparent electrode 17 may be provided at the greatest gap in the first region in which the first electrode pad 25 is provided. For example, the gap between the first electrode pad 25 and the transparent electrode 17 may be provided in the range of about 2 μm to about 200 μm in the first region. In addition, the first electrode 24 and the transparent electrode 17 may be provided at the smallest gap in the second region in which the end portion of the first electrode finger part 27 is provided.

According to the embodiment, the first electrode finger part 27 may have a constant width from the first region toward the second region. In addition, the transparent electrode 17 may have an inverse V shape from the first region to the second region.

As described above, the first electrode pad 25, the second conductive semiconductor layer 15, and the transparent electrode 17 are spaced apart from each other at the greatest gap in the first region, thereby preventing current crowding in the first region. If power is applied to the first electrode pad 25, and if the first electrode pad 25 is closer to the transparent electrode 17, electrons or holes applied to the first electrode pad 25 are not moved through the first electrode finger part 27, but may flow to the transparent electrode 17 in only a region adjacent to the first electrode pad 25. Therefore, current crowding is caused in the vicinity of the first electrode pad 25, so that the light extraction efficiency can be degraded.

However, according to the embodiment, the gap between the first electrode finger part 27 and the transparent electrode 17 is narrowed from the first region to the second region, so that electrons or holes can be transferred to the transparent electrode 17 throughout the whole region of the first electrode finger part 27. Therefore, current crowding is prevented from being caused in a specific region of the first electrode 24, so that light extraction efficiency can be improved.

Hereinafter, a method for fabricating the light emitting device according to the embodiment will be described with reference to FIGS. 3 to 5.

Figure 3:
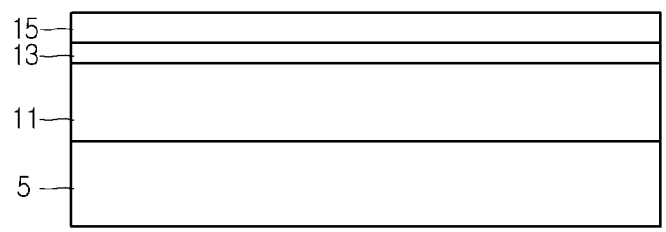
FIGS. 3 to 5 are sectional views showing a method for fabricating the light emitting device according to the embodiment.

According to the method for fabricating the light emitting device according to the embodiment, as shown in FIG. 3, the first conductive semiconductor layer 11, the active layer 13, and the second conductive semiconductor layer 15 are formed on the substrate 5. For example, the substrate 5 may comprise at least one selected from the group consisting of sapphire (Al2O3), SiC, GaAs, GaN, ZnO, Si, GaP, InP, and Ge, but the embodiment is not limited thereto.

The buffer layer may be additionally provided between the first conductive semiconductor layer 11 and the substrate 5.

For example, the first conductive semiconductor layer 11 may comprise an N type semiconductor layer doped with N-type dopants serving as first conductive dopants, and the second conductive semiconductor layer 15 may comprise a P type semiconductor layer doped with P-type dopants serving as the second conductive dopants. In addition, the first conductive semiconductor layer 11 may comprise a P-type semiconductor layer, and the second conductive semiconductor layer 15 may comprise an N-type semiconductor layer.

For example, the first conductive semiconductor layer 11 may comprise an N-type semiconductor layer. The first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of InAlGaN, GaN, AlGaN, AlInN, InGaN, AlN, and InN and may be doped with N-type dopants such as Si, Ge, and Sn.

The active layer 13 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer

15. The active layer 13 may have one of a single quantum well (SQW) structure, a multi-quantum well (MQW) structure, a quantum dot structure, and a quantum wire structure, but the embodiment is not limited thereto.

For example, the active layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 13 has an MQW structure, the active layer 13 may be formed by stacking a plurality of well layers and a plurality of barrier layers. For example, the active layer 13 may have a cycle of InGaN well layer/GaN barrier layer.

For example, the second conductive semiconductor layer 15 may comprise a P-type semiconductor layer. The second conductive semiconductor layer 15 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 15 may comprise one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may comprise a P-type semiconductor layer and the second conductive semiconductor layer 15 may comprise the N-type semiconductor layer. In addition, a third semiconductor layer (not shown) comprising an N-type or P-type semiconductor layer may be disposed on the second conductive semiconductor layer 15. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 13. In addition, a second conductive AlGaN layer may be formed between the second conductive semiconductor layer 15 and the active layer 13.

Figure 4:
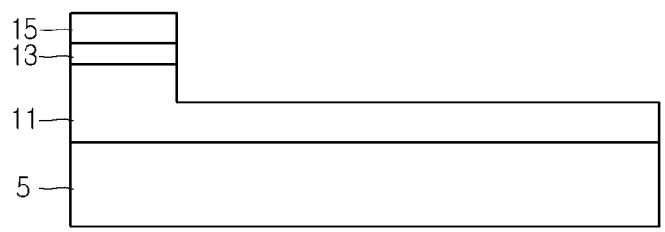

Thereafter, as shown in FIG. 4, a mesa etching process is performed with respect to the second conductive semiconductor layer 15 and the active layer 13. In this case, a portion of the first conductive semiconductor layer 112 may be etched.

Figure 5:
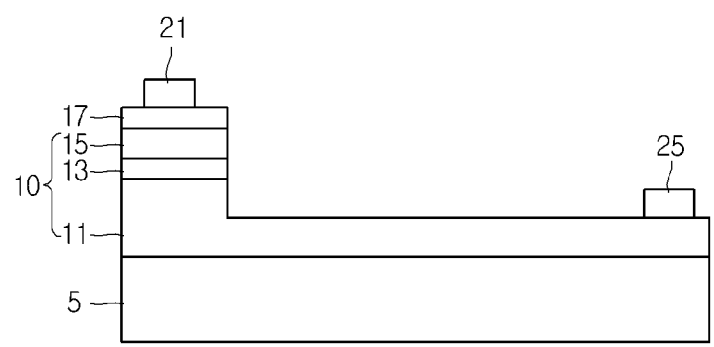

Next, as shown in FIG. 5, the first electrode 24 is formed on the first conductive semiconductor layer 11, and the transparent electrode 17 and the second electrode 20 are formed on the second conductive semiconductor layer 15. In this case, as described with reference to FIGS. 1 and 2, the first electrode 24 comprises the first electrode pad 25 and the first electrode forger part 27, and the second electrode 20 comprises the second electrode pad 21 and the second electrode finger part 23.

According to the embodiment, the first electrode finger part 27 may be realized with a constant width from the first region toward the second region. In addition, the transparent electrode 17 may have an inverse V shape from the first region toward the second region.

Figure 6:
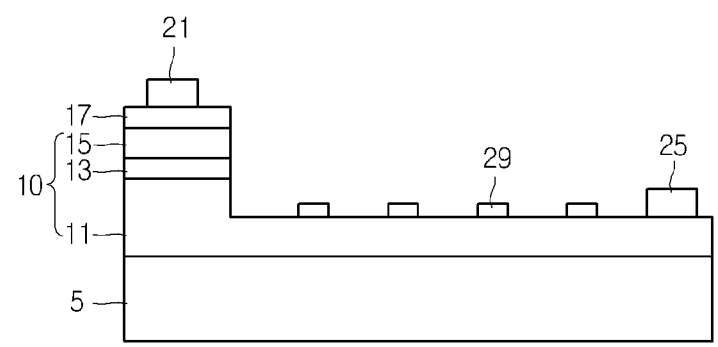
FIG. 6 is a sectional view showing another example of the light emitting device according to the embodiment.

FIG. 6 is a sectional view showing another example of the light emitting device according to the embodiment.

The light emitting device according to the embodiment shown in FIG. 6 makes a differences from the light emitting device described with reference to FIGS. 1 and 2 in that the light emitting device of FIG. 6 has a concavo-convex pattern 29. In this case, the light emitting device according to the embodiment shown in FIG. 6 will be described while focusing on the difference from the light emitting device described with reference to FIGS. 1 and 2. The concavo-convex pattern 29 may be formed on the first conductive semiconductor layer 11 exposed from both of the second conductive semiconductor layer 15 and the active layer 13. The concavo-convex pattern 29 may be provided in the vicinity of the first electrode finger part 27. Accordingly, the light extraction efficiency can be more improved by the concavo-convex pattern 29. For example, the concavo-convex pattern 29 may be formed when the mesa etching process is performed with respect to the second conductive semiconductor layer 15 and the active layer 13.

Figure 7:
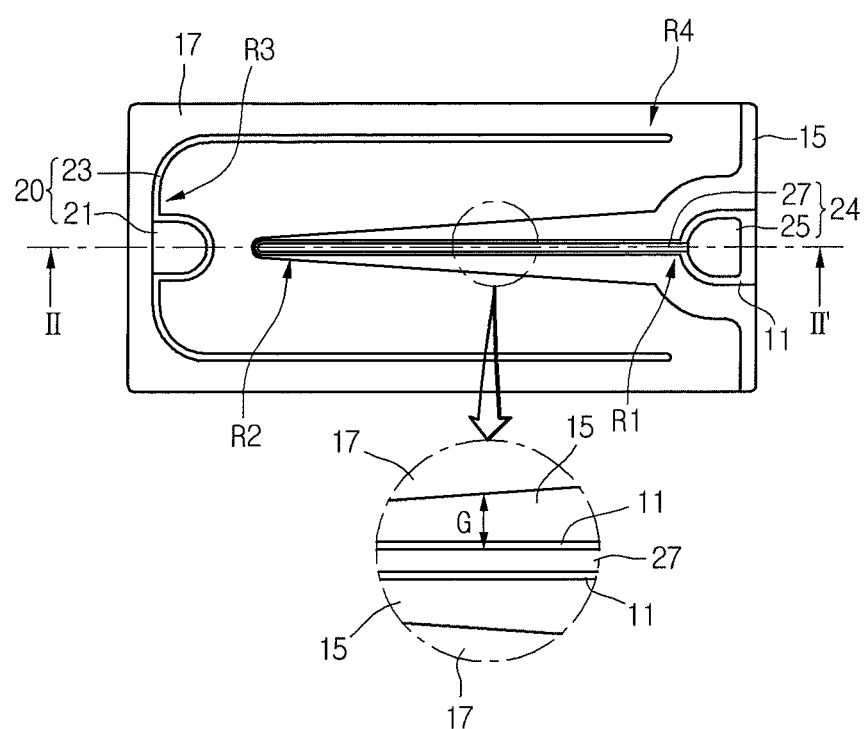
FIG. 7 is a view showing still another example of the light emitting device according to the embodiment.
Figure 8:
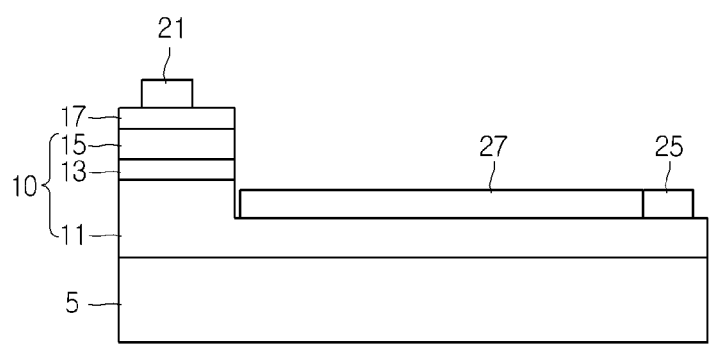
FIG. 8 is a sectional view showing taken along line II-II' of the light emitting device shown in FIG. 7.

FIG. 7 is a view showing still another example of the light emitting device according to the embodiment, and FIG. 8 is a sectional view showing taken along line II-II' of the light emitting device of FIG. 7.

As shown in FIGS. 7 and 8, the light emitting device according to the embodiment may comprise the substrate 5, the light emitting structure 10, the transparent electrode 17, the first electrode 24, and the second electrode 20.

The light emitting structure 10 may be provided on the substrate 5. The substrate 5 may comprise at least one of sapphire (Al2O3), SiC, Si, GaAs, GaN, ZnO, GaP, TnP, and Ge. A top surface of the substrate 5 may be patterned in a predetermined shape. A buffer layer may be interposed between the substrate 5 and the light emitting structure 10 to improve crystalline of the light emitting structure 10. For example, the buffer layer may be realized by using a compound semiconductor comprising group III-V elements. The buffer layer may be realized by using an undoped semiconductor layer. For example, the buffer layer may be realized by an undoped GaN-based semiconductor layer.

The light emitting structure 10 may comprise the first conductive semiconductor layer 11, the active layer 13, and the second conductive semiconductor layer 15. For example, the first conductive semiconductor layer 11 may comprise an N-type semiconductor layer doped with N-type dopants serving as first conductive dopants, and the second conductive semiconductor layer 15 may comprise a P-type semiconductor layer doped with P-type dopants serving as second conductive dopants. In addition, the first conductive semiconductor layer 11 may comprise a P-type semiconductor layer, and the second conductive semiconductor layer 15 may comprise an N-type semiconductor layer.

For example, the first conductive semiconductor layer 11 may comprise an N-type semiconductor layer. The first conductive semiconductor layer 11 may be realized by using a compound semiconductor. The first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of GaN, AlN, AlGaN, InGaN, InN, InAlGaN, AlInN, AlGaAs, GaP, GaAs, GaAsP, and AlGaTnP doped with N-type dopants such as Si, Ge, Sn, Se, and Te.

The active layer 13 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 15. The active layer 13 may have one of a single quantum well (SQW) structure, a multi-quantum well (MQW) structure, a quantum dot structure, and a quantum wire structure, but the embodiment is not limited thereto.

For example, the active layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 13 has an MQW structure, the active layer 13 may be formed by stacking a plurality of well layers and a plurality of barrier layers. For example, the active layer 13 may have a cycle of InGaN well layer/GaN barrier layer. In addition, the active layer 13 may have a cycle of well layer/barrier layer, for example, a cycle of $In_xAl_yGa_{(1-x-y)}N$ well layer/$In_aAl_bGa_{(1-a-b)}N$ barrier layer ($0<x \leq 1$, $0 \leq y \leq 1$, $0 \leq x+y \leq 1$, $0 \leq a \leq 1$, $0 \leq b \leq 1$, $0 \leq a+b \leq 1$) by using a compound semiconductor material comprising group III-V elements.

For example, the second conductive semiconductor layer 15 may comprise a P-type semiconductor layer. The second conductive semiconductor layer 15 may be realized by using a compound semiconductor. The second conductive semiconductor layer 15 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 15 may comprise one selected from the group consisting of GaN, AlN, AlGaN, InGaN, InN, InAlGaN, AlInN, AlGaAs, GaP, GaAs, GaAsP, and AlGaTnP doped with P-type dopants such as Mg, Zn, Ca, Sr, and Ba.

Meanwhile, the first conductive semiconductor layer 11 may comprise a P-type semiconductor layer and the second conductive semiconductor layer 15 may comprise the N-type semiconductor layer. In addition, a third semiconductor layer (not shown) comprising an N-type or P-type semiconductor layer may be additionally disposed on the second conductive semiconductor layer 15. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 13. In addition, a second conductive AlGaN layer may be formed between the second conductive semiconductor layer 15 and the active layer 13.

The first electrode 24 may be provided on the first conductive semiconductor layer 11. The first electrode 24 may comprise the first electrode pad 25 and the first electrode finger part 27. The first electrode 24 may be provided on the first conductive semiconductor layer 11 exposed from both the second conductive semiconductor layer 17 and the active layer 15. The first electrode pad 25 may be provided in the first region R1 of the first conductive semiconductor layer 11 that is exposed. The first electrode finger part 27 may extend from the first electrode pad 25 to the second region R2 of the first conductive semiconductor layer 11 that is exposed.

The transparent electrode 17 and the second electrode 20 may be provided on the second conductive semiconductor layer 15. The second electrode 20 may comprise the second electrode pad 21 and the second electrode finger part 23. The second electrode pad 21 may be provided in the third region R3 of the second conductive semiconductor layer 15. The second electrode finger part 23 may extend from the second electrode pad 21 to the fourth region R4 of the second conductive semiconductor layer 15.

The first and second electrodes 24 and 20 may supply power to the light emitting structure 10. The power applied to the first electrode pad 25 may be applied to the first conductive semiconductor layer 11 through the first electrode finger part 27. The power applied to the second electrode pad 21 may be applied to the second conductive semiconductor layer 15 through the second electrode finger part 23. The power applied to the second electrode finger part 23 may be applied to the second conductive semiconductor layer 15 through the transparent electrode 17.

The transparent electrode 17 may be interposed between the second electrode pad 21 and the second conductive semiconductor layer 15. The transparent electrode 17 may provide an ohmic contact between the second electrode pad 21 and the second conductive semiconductor layer 15. The transparent electrode 17 may be interposed between the second electrode finger part 23 and the second conductive semiconductor layer 15. The transparent electrode 17 may provide an ohmic contact between the second electrode finger part 23 and the second conductive semiconductor layer 15. The transparent electrode 17 may be provided on the second conductive semiconductor layer 15. The transparent electrode 17 may supply the power, which is applied to the second electrode pad 21, to the second conductive semiconductor layer 15 by spreading the power.

For example, the transparent electrode 17 may comprise a transparent conductive oxide layer. The transparent electrode 17 may comprise a transparent metallic layer. For example, the transparent electrode 17 may comprise a conductive material representing at least 50% of transmittance. The transparent electrode 17 may comprise at least one material selected from the group consisting of ITO, IZO, AZO, AGZO, IZTO, IAZO, IGZO, IGTO, ATO, GZO, IZON, ZnO, IrOx, RuOx, NiO, and Ni/Au.

According to the embodiment, the second conductive semiconductor layer 15 and the active layer 13 may be provided in the vicinity of the first electrode finger part 27. The gap between the second conductive semiconductor layer 15 and the first electrode finger part 27 may be constantly provided, from the first region in which the first electrode pad 25 is provided, toward the second region in which the end portion of the first electrode finger part 27 is provided. The gap between the active layer 13 and the first electrode finger part 27 may be constantly provided from the first region, in which the first electrode pad 25 is provided, toward the second region, in which the end portion of the first electrode finger part 23 is provided. The second conductive semiconductor layer 15 exposed by the transparent electrode 17 may be interposed between the transparent electrode 17 and the first electrode finger part 27.

According to the embodiment, the transparent electrode 17 may be provided in the vicinity of the first electrode finger part 27. The gap G between the transparent electrode 17 and the first electrode finger part 27 may be gradually narrowed from the first region R1, in which the first electrode pad 25 is provided, toward the second region R2 in which the end portion of the first electrode finger part 27 is provided.

According to the embodiment, the first electrode 24 and the transparent electrode 17 may be provided at the greatest gap in the first region in which the first electrode pad 25 is provided. For example, the gap between the first electrode pad 25 and the transparent electrode 17 may be provided in the range of about 2 μm to about 200 μm in the first region. In addition, the first electrode 24 and the transparent electrode 17 may be provided at the smallest gap in the second region in which the end portion of the first electrode finger part 27 is provided.

According to the embodiment, the first electrode finger part 27 may have a constant width from the first region toward the second region. In addition, the transparent electrode 17 may have an inverse V shape from the first region toward the second region.

As described above, the first electrode pad 25 and the transparent electrode 17 are spaced apart from each other at the greatest gap in the first region, thereby preventing current crowding in the first region. If power is applied to the first electrode pad 25, and if the first electrode pad 25 is closer to the transparent electrode 17, electrons or holes applied to the first electrode pad 25 are not moved through the first electrode finger part 27, but may flow to the transparent electrode 17 in only a region adjacent to the first electrode pad 25. Therefore, current crowding is caused in the vicinity of the first electrode pad 25, so that the light extraction efficiency can be degraded.

However, according to the embodiment, the gap between the first electrode finger part 27 and the transparent electrode 17 is gradually narrowed from the first region toward the second region, so that electrons or holes can be transferred to the transparent electrode 17 throughout the whole region of the first electrode finger part 17. Therefore, current crowding is prevented from being caused in a specific region of the first electrode 24, so that light extraction efficiency can be improved.

Figure 9:
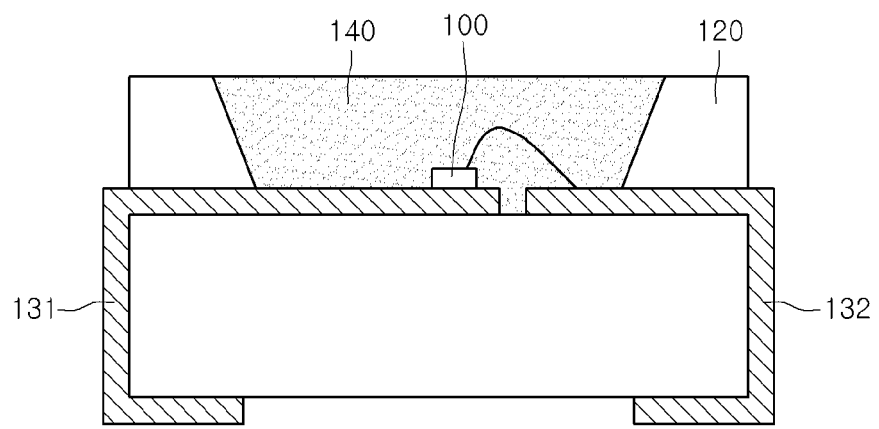
FIG. 9 is a sectional view showing a light emitting device package to which the light emitting device according to the embodiment is applied.

FIG. 9 is a sectional view showing a light emitting device package to which the light emitting device according to the embodiment is applied.

Referring to FIG. 9, the light emitting device package according to the embodiment comprises a body 120, first and second lead electrodes 131 and 132 formed on the body 120, a light emitting device 100 provided on the body 20 and electrically connected to the first and second lead electrodes 131 and 132 and a molding member 140 that surrounds the light emitting device 100.

The body 120 may comprise silicon, synthetic resin or metallic material, and an inclined surface may be formed in the vicinity of the light emitting device 100.

The first and second lead electrodes 131 and 132 are electrically isolated from each other and formed by passing through the body 120. The first and second lead electrode 131 and 132 supply power to the light emitting device 100 and improve the light efficiency by reflecting the light emitted from the light emitting device 100. Further, the first and second lead electrodes 131 and 132 dissipate heat generated from the light emitting device 100 to the outside.

The light emitting device 100 can be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 surrounds the light emitting device 100 to protect the light emitting device 100. In addition, the molding member 140 may comprise phosphors to change the wavelength of the light emitted from the light emitting device 100.

A plurality of light emitting device or light emitting device packages according to the embodiment may be arrayed on a board, and an optical member comprising a lens, a light guide plate, a prism sheet, or a diffusion sheet may be provided on the optical path of the light emitted from the light emitting device package. The light emitting device package, the board, and the optical member may serve as a light unit. The light unit is realized in a top view type or a side view type and provided in a display device of a portable terminal and a laptop computer. In addition, the light unit is applicable to various apparatuses such as a lighting apparatus and an indicator apparatus. In addition, a lighting apparatus according to another embodiment can comprise a light emitting device, or a light emitting device package according to the embodiment. For example, the lighting apparatus may comprise an indicator, a signal lamp, and a headlight of a vehicle, an electric sign board.

Figure 11:
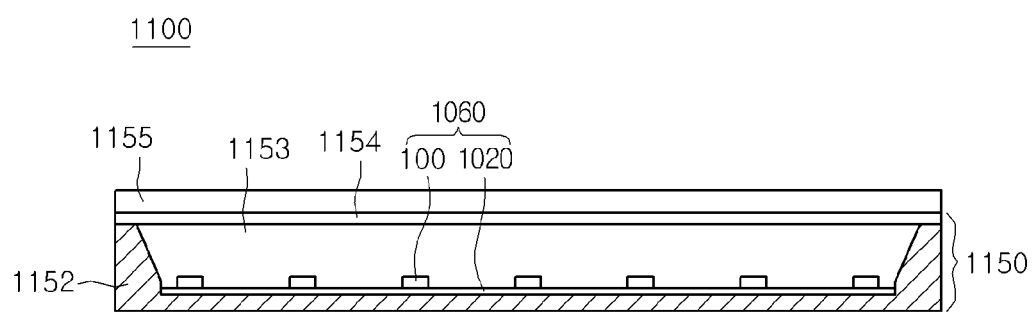
FIG. 11 is a sectional view showing another example of a display device to which the light emitting device according to the embodiment is applied.
Figure 12:
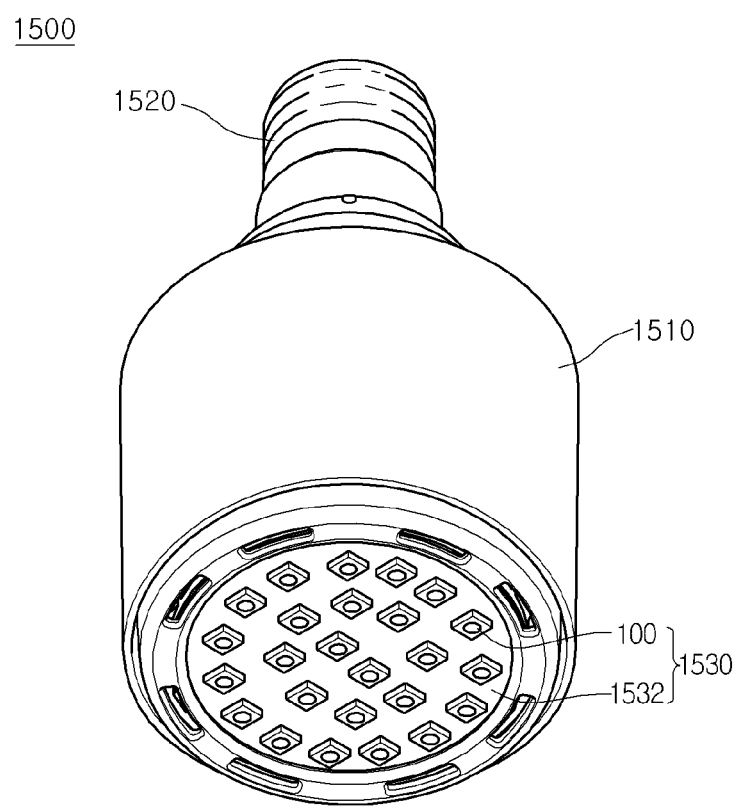
FIG. 12 is a perspective view showing a lighting apparatus according to the embodiment.

The light emitting device according to the embodiment may be applied to the light unit. The light unit has a structure in which a plurality of light emitting devices are arrayed. The light unit may constitute a display device as shown in FIGS. 10 and 11 and the lighting apparatus as shown in FIG. 12.

Figure 10:
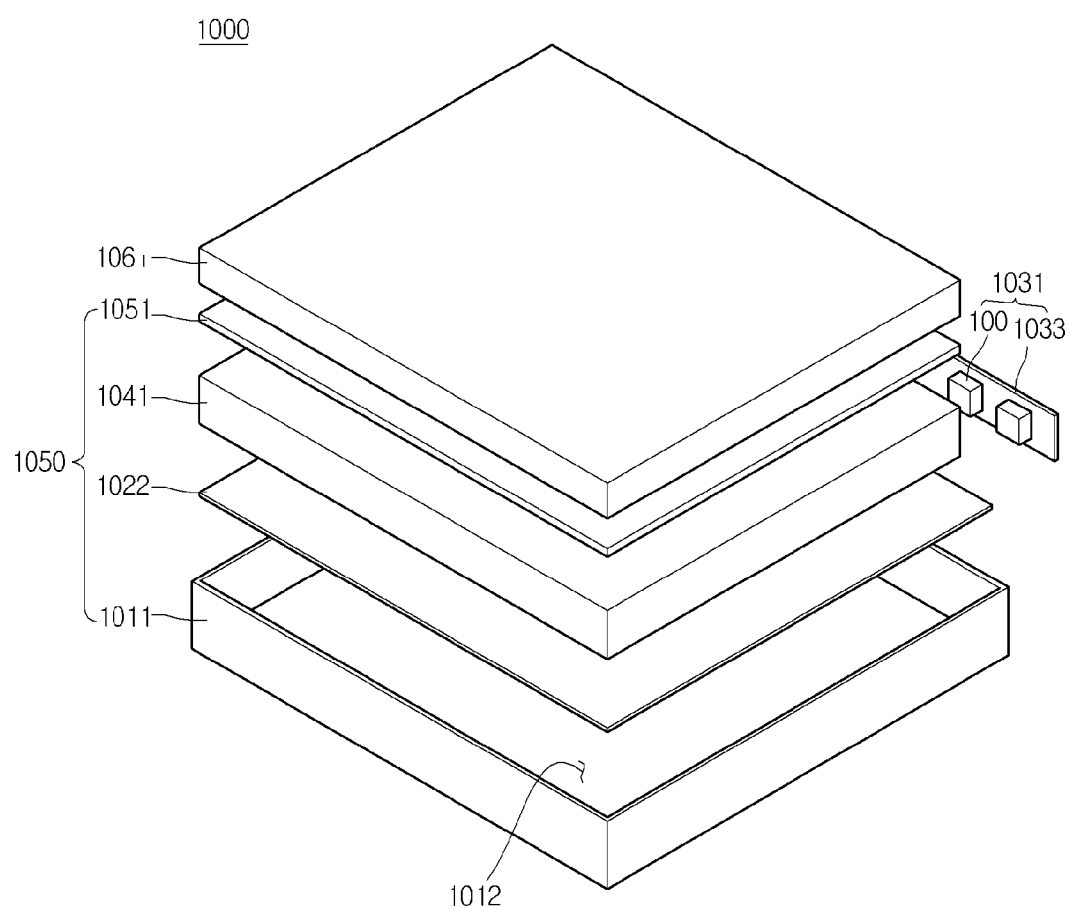
FIG. 10 is a view showing a display device to which the light emitting device according to the embodiment is applied.

Referring to FIG. 10, a display device 1000 according to the embodiment comprises a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may comprise transparent material. For example, the light guide plate 1041 may comprise one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may comprise a board 1033 and light emitting devices 100 according to the embodiment described above. The light emitting devices 100 may be arrayed on the board 1033 while being spaced apart from each other at the predetermined gap.

The board 1033 may be a printed circuit board (PCB) comprising a circuit pattern, but the embodiment is not limited thereto. In addition, the board 1033 may also comprise a metal core PCB (MCPCB) or a flexible PCB (FPCB) as well as the PCB, but the embodiment is not limited thereto. If the light emitting devices 100 are installed on the side of the bottom cover 1011 or on a heat dissipation plate, the board 1033 may be omitted. The heat dissipation plate partially may make contact with the top surface of the bottom cover 1011.

In addition, the light emitting devices 100 are installed such that light exit surfaces of the light emitting devices 100 are spaced apart from the light guide plate 1041 at a predetermined distance, but the embodiment is not limited thereto. The light emitting devices 100 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for example, is an LCD panel comprising first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors or laptop computers, and televisions.

The optical sheet 1051 is disposed between the display panel 1061 and the light guide plate 1041 and comprises at least one transmissive sheet. For example, the optical sheet 1051 comprises at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the light path of the light emitting module 1031 as optical members, but the embodiment is not limited thereto.

FIG. 11 is a sectional view showing another example of a display device 1100 according to the embodiment.

Referring to FIG. 11, the display device 1100 comprises a bottom cover 1152, a board 1020 on which the light emitting devices 100 are arrayed, an optical member 1154, and a display panel 1155.

The board 1020 and the light emitting devices 100 may constitute a light emitting module 1060. In addition, the bottom cover 1152, at least one light emitting module 1060, and the optical member 1154 may constitute the light unit (not shown).

The bottom cover 1152 can be provided therein with a receiving section 1153, but the embodiment is not limited thereto.

The optical member 1154 may comprise at least one of a lens, a light guide plate, a diffusion sheet, a horizontal and vertical prism sheet, and a brightness enhanced sheet. The light guide plate may comprise PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 12 is a perspective view showing a lighting apparatus according to the embodiment.

Referring to FIG. 12, a lighting device 1500 comprises a case 1510, a light emitting module 1530 installed in the case 1510, and a connector 1520 installed in the case 1510 to receive power from an external power source.

Preferably, the case 1510 comprises material having superior heat dissipation property. For example, the case 1510 comprises metallic material or resin material.

The light emitting module 1530 may comprise a board 1532 and light emitting devices 100 according to the embodiment installed on the board 1532. The light emitting devices 100 are spaced apart from each other or arranged in the form of a matrix.

The board 1532 comprises an insulating member printed with a circuit pattern. For example, the board 1532 comprises a PCB, an MCPCB, an FPCB, a ceramic PCB, and an FR-4 board.

In addition, the board 1532 may comprise material that effectively reflects the light. A coating layer can be formed on the surface of the board 1532. At this time, the coating layer has a white color or a silver color to effectively reflect the light.

At least one light emitting device 100 is installed on the board 1532. Each light emitting device 100 may comprise at least one LED (light emitting diode) chip. The LED chip may comprise an LED that emits the light of visible ray band having red, green, blue or white color and a UV (ultraviolet) LED that emits UV light.

The light emitting module 1530 can be variously combined to provide various colors and brightness. For example, the white LED, the red LED and the green LED can be combined to achieve the high color rendering index (CRI).

The connector 1520 is electrically connected to the light emitting module 1530 to supply power to the light emitting module 1530. The connection terminal 1520 has a shape of a socket screw-coupled with the external power source, but the embodiment is not limited thereto. For example, the connector 1520 can be prepared in the form of a pin inserted into the external power source or connected to the external power source through a wire.

According to the embodiment, the light emitting device 100 has been packaged and mounted on the board, thereby realizing a light emitting module. The light emitting device 100 is mounted in the form of an LED chip and packaged, thereby realizing a light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure comprising a first conductive semiconductor layer, an active layer on the first conductive semiconductor layer, and a second conductive semiconductor layer on the active layer;
a first electrode on the first conductive semiconductor layer;
a transparent electrode on the second conductive semiconductor layer; and
a second electrode on the transparent electrode,
wherein the first electrode comprises a first electrode pad on a first region of the first conductive semiconductor layer exposed from the second conductive semiconductor layer and the active layer and a first electrode finger part extending from the first electrode pad toward a second region, in which the first conductive semiconductor layer is exposed, and
wherein a gap between the transparent electrode and the first electrode finger part is gradually narrowed along an entire length of the first electrode.

2. The light emitting device of claim 1, wherein a gap between the second conductive semiconductor layer and the first electrode finger part is gradually narrowed from the first region toward the second region.

3. The light emitting device of claim 1, wherein a gap between the second conductive semiconductor layer and the first electrode finger part is constantly provided from the first region toward the second region.

4. The light emitting device of claim 1, wherein a gap between the active layer and the first electrode finger part is constantly provided from the first region toward the second region.

5. The light emitting device of claim 1, wherein the second electrode comprises a second electrode pad in a third region and a second electrode finger part extending from the second electrode pad to a fourth region.

6. The light emitting device of claim 1, wherein a concavo-convex pattern is formed on the first conductive semiconductor layer exposed from the second conductive semiconductor layer and the active layer.

7. The light emitting device of claim 6, wherein the concavo-convex pattern is provided in vicinity of the first electrode finger part.

8. The light emitting device of claim 1, wherein the transparent electrode comprises at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, and Ni/Au.

9. The light emitting device of claim 1, wherein the second conductive semiconductor layer exposed by the transparent electrode is interposed between the transparent electrode and the first electrode finger part.

10. A light emitting device comprising:
a light emitting structure comprising a first conductive semiconductor layer, an active layer on the first conductive semiconductor layer, and a second conductive semiconductor layer on the active layer;
a first electrode on the first conductive semiconductor layer;
a transparent electrode on the second conductive semiconductor layer; and
a second electrode on the transparent electrode,
wherein the first electrode comprises a first electrode pad on a first region of the first conductive semiconductor layer exposed from the second conductive semiconductor layer and the active layer and a first electrode finger part extending from the first electrode pad to a second region, in which the first conductive semiconductor layer is exposed, and having a constant width,
wherein a gap between the transparent electrode and the first electrode finger part is gradually narrowed from the first region toward the second region, and wherein the transparent electrode has an inverse V-shape from the first region to the second region, the gap being formed between edges of the inverse V-shape and the first electrode finger part.

11. The light emitting device of claim 10, wherein a gap between the second conductive semiconductor layer and the first electrode finger part is gradually narrowed from the first region toward the second region.

12. The light emitting device of claim 10, wherein a gap between the second conductive semiconductor layer and the first electrode finger part is constantly provided from the first region toward the second region.

13. The light emitting device of claim 10, wherein a gap between the active layer and the first electrode finger part is constantly provided from the first region toward the second region.

14. The light emitting device of claim 10, wherein a concavo-convex pattern is formed on the first conductive semiconductor layer exposed from the second conductive semiconductor layer and the active layer.

15. The light emitting device of claim 10, wherein the second conductive semiconductor layer exposed by the transparent electrode is interposed between the transparent electrode and the first electrode finger part.

16. A light emitting device package comprising:
a body;
a light emitting device on the body; and
first and second lead electrodes electrically connected to the light emitting device,
wherein the light emitting device comprises a light emitting structure comprising a first conductive semiconductor layer, an active layer on the first conductive semiconductor layer, and a second conductive semiconductor layer on the active layer, a first electrode on the first conductive semiconductor layer, a transparent electrode on the second conductive semiconductor layer, and a second electrode on the transparent electrode,
wherein the first electrode comprises a first electrode pad on a first region of the first conductive semiconductor layer exposed from the second conductive semiconductor layer and the active layer and a first electrode finger part extending in a length direction from the first electrode pad to a second region, in which the first conductive semiconductor layer is exposed,
wherein a gap between the transparent electrode and the first electrode finger part is gradually narrowed from the first region toward the second region,
wherein a width of the electrode pad is less than a width of the transparent electrode, and
wherein the gap between the transparent electrode and the first electrode finger part is gradually narrowed along an entire length of the first electrode.

17. The light emitting device package of claim 16, wherein a gap between the second conductive semiconductor layer and the first electrode finger part is gradually narrowed from the first region toward the second region.

18. The light emitting device package of claim 16, wherein a gap between the second conductive semiconductor layer and the first electrode finger part is constantly provided from the first region toward the second region.

19. The light emitting device package of claim 16, wherein the first electrode finger part is provided with a constant width from the first region to the second region.

* * * * *